United States Patent
Soell et al.

(10) Patent No.: US 11,908,384 B2
(45) Date of Patent: Feb. 20, 2024

(54) METHOD OF GENERATING A PWM SIGNAL AND CIRCUIT FOR GENERATING A PWM SIGNAL

(71) Applicant: OSRAM Opto Semiconductors GmbH, Regensburg (DE)

(72) Inventors: Christopher Soell, Zirndorf (DE); Markus Koesler, Landshut (DE); Jens Richter, Hemau (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 17/609,396

(22) PCT Filed: Apr. 27, 2020

(86) PCT No.: PCT/EP2020/061616
§ 371 (c)(1),
(2) Date: Nov. 7, 2021

(87) PCT Pub. No.: WO2020/225006
PCT Pub. Date: Nov. 12, 2020

(65) Prior Publication Data
US 2022/0189384 A1    Jun. 16, 2022

(30) Foreign Application Priority Data
May 7, 2019    (DE) .................. 10 2019 111 805.0

(51) Int. Cl.
*G09G 3/32* (2016.01)
*G11C 19/00* (2006.01)
*H03K 3/017* (2006.01)

(52) U.S. Cl.
CPC ............... *G09G 3/32* (2013.01); *G11C 19/00* (2013.01); *H03K 3/017* (2013.01); *G09G 2310/0286* (2013.01); *G09G 2320/064* (2013.01)

(58) Field of Classification Search
CPC ............ G09G 3/32; G09G 2310/0286; G09G 2320/064; G09G 2310/0264; H05B 45/325; G11C 19/00; H03K 3/017
See application file for complete search history.

(56) References Cited

U.S. PATENT DOCUMENTS 5,367,514 A    11/1994    Kobayashi et al.
8,378,719 B1    2/2013    Pace
(Continued)

FOREIGN PATENT DOCUMENTS

CN    101783117 A    7/2010
CN    104240628 A    12/2014
(Continued)

OTHER PUBLICATIONS

International Search Report issued for corresponding International Patent Application No. PCT/EP2020/061616 dated Jun. 29, 2020, along with an English translation.
(Continued)

*Primary Examiner* — Muhammad N Edun
(74) *Attorney, Agent, or Firm* — HAUPTMAN HAM, LLP

(57) ABSTRACT

A circuit for generating a PWM signal includes a shift register having a plurality of clock-controlled register units. Each clock-controlled register unit has an input and an output. The circuit also includes a write unit configured to set the outputs of the register units each to a designated logical value. The circuit further includes a clock generator configured to drive the register units with a common clock (Continued)

signal. The register units are connected in series. The shift register is configured to output the PWM signal at an output contact. The PWM signal is a chronological sequence of the logical values set in the register units, the PWM signal assumes each of the logical values with the duration of one clock of the clock signal, the clock signal is cyclic, during one cycle the duration of successive clocks changes, and the clock signal is identical per cycle.

13 Claims, 7 Drawing Sheets

(56) References Cited

U.S. PATENT DOCUMENTS

| | | | | |
|---|---|---|---|---|
| 2006/0001784 A1* | 1/2006 | Isono | ............ | H04N 3/14 |
| | | | | 348/800 |
| 2006/0064609 A1* | 3/2006 | Bryan | ............ | H03K 7/08 |
| | | | | 714/700 |
| 2017/0256209 A1* | 9/2017 | Kang | ............ | G09G 3/3413 |
| 2017/0330509 A1* | 11/2017 | Cok | ............ | G09G 3/2014 |
| 2018/0122286 A1* | 5/2018 | Wu | ............ | G09G 3/32 |
| 2018/0268761 A1 | 9/2018 | Kuo et al. | | |

FOREIGN PATENT DOCUMENTS

| | | |
|---|---|---|
| CN | 105868148 A | 8/2016 |
| DE | 10 2013 223 711 A1 | 5/2015 |
| JP | H7-154214 A | 6/1995 |
| JP | H8-62581 A | 3/1996 |
| JP | 2005-304017 A | 10/2005 |
| JP | 2018-519539 A | 7/2018 |
| WO | 2019/032899 A1 | 2/2019 |

OTHER PUBLICATIONS

Written Opinion issued for corresponding International Patent Application No. PCT/EP2020/061616 dated Jun. 29, 2020.

Office Action dated Sep. 21, 2023 for corresponding Chinese Patent Application No. 202080033979.6, along with an English translation (33 pages).

* cited by examiner

FIG 7
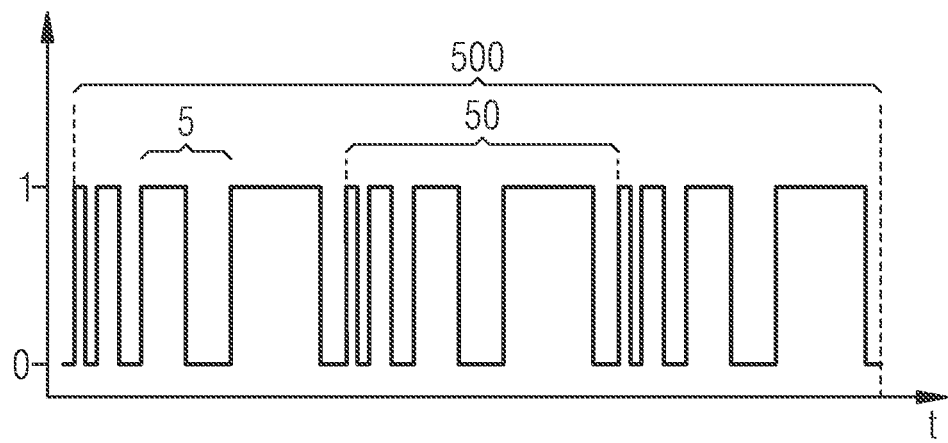
FIG 8
a)
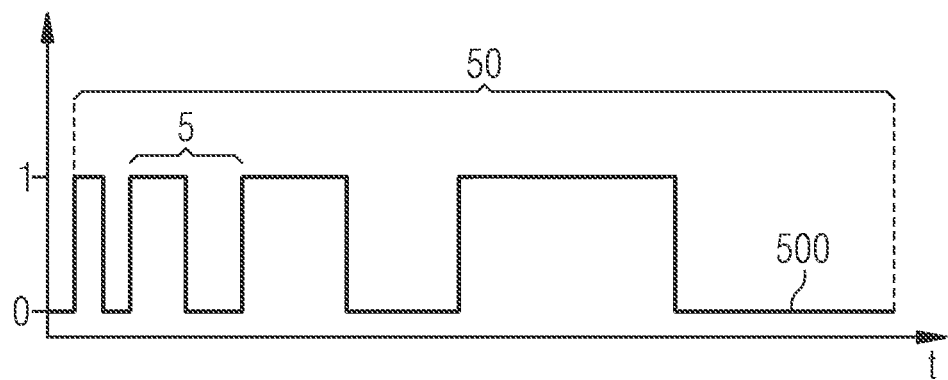
b)
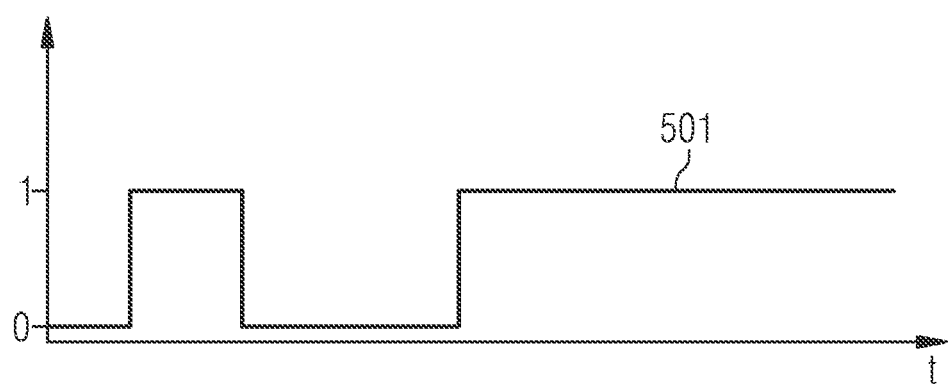

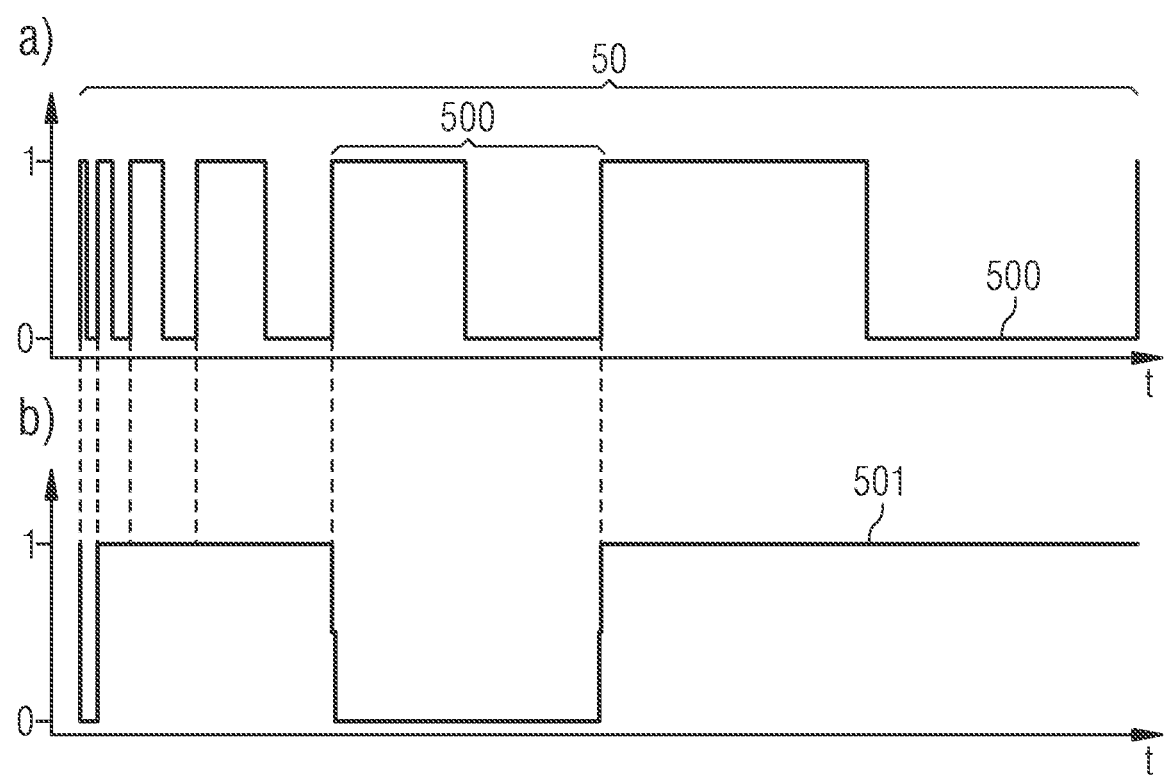

METHOD OF GENERATING A PWM SIGNAL AND CIRCUIT FOR GENERATING A PWM SIGNAL

CROSS REFERENCE TO RELATED APPLICATION

This application is a National Stage of International Application No. PCT/EP2020/061616, filed on Apr. 27, 2020, which designates the United States and was published in Europe, and which claims priority to German Patent Application No. 10 2019 111 805.0, filed on May 7, 2019, in the German Patent Office. Both of the aforementioned applications are hereby incorporated by reference in their entireties.

A method for generating a PWM signal is disclosed. Furthermore, a circuit for generating a PWM signal is disclosed. Also disclosed are a light emitting arrangement and a method of operating a light emitting arrangement. Also disclosed are a display arrangement and a method of operating a display arrangement.

One object to be solved is to specify a method for generating a PWM signal by which electronic components can be controlled particularly efficiently. A further object to be solved consists in specifying a circuit for generating such a PWM signal. Furthermore, an object to be solved consists in specifying a particularly efficient method for operating a light-emitting arrangement and a display arrangement. Furthermore, an object to be solved consists in specifying a light-emitting arrangement and a display arrangement which can be driven particularly efficiently.

In the method of generating a PWM signal using a circuit, the circuit comprises a shift register having a plurality of clock-controlled register units each having an input and an output. For example, the shift register comprises four, eight, or 16 register units.

The shift register is, for example, a sequential logic circuit that can be used for storing or transmitting binary data. Digital logic values can be written to the shift register in parallel or serial and output in parallel or serial. The shift register is, for example, an electronic component provided in the form of an IC chip or integrated on a driver IC.

The register units each have two stable states in which the output assumes either the logical value 0 or the logical value 1. Thus, a data quantity of 1 bit can be stored in each register unit. The register units are designed, for example, as bistable flip-flops. The register units are, for example, RS flip-flops or D flip-flops. For example, the register units are state-controlled or clock edge-controlled. For example, a logic value 1 is represented by a high level and a logic value 0 is represented by a low level of a digital voltage signal. For example, a high level corresponds to an electrical voltage of 5 V and a low level corresponds to an electrical voltage of 0 V.

The circuit comprises a write unit which is configured to set the outputs of each of the register units to an intended logical value. The register units are connected in series so that a logical value at the output of one of the register units is applied to the input of the respective subsequent register unit.

The circuit comprises a clock generator which is configured to output a clock signal. The register units are operated together with the same clock signal. The clock signal is a serial digital signal comprising successive clocks in time. A clock may be a state change from a logical value 0 to a logical value 1, also referred to as a positive clock edge, or a state change from a logical value 1 to a logical value 0, also referred to as a negative clock edge. Alternatively, the clock may be a state in which the clock signal takes the logic value 0 or the logic value 1.

The clock signal is a cyclic signal, whereby different cycles of the clock signal have an identical sequence of clocks. Within a cycle, the duration of successive clocks changes. For example, the duration of successive clocks lengthens, in particular doubles, within a cycle. Alternatively, the duration of successive clocks within a cycle is shortened, in particular halved.

In the method for generating a PWM signal, in a method step a) the outputs of the register units are each set to a predetermined logical value by the write unit.

In a method step b), the register units are operated together with the clock signal, whereby the register units take over the respective logical value of the input at the output with each clock pulse.

The shift register outputs the PWM signal at an output contact. The PWM signal is a chronological sequence of the logic values set in the register units, and the PWM signal accepts the logic values with the duration of one clock of the clock signal.

The PWM signal is a pulse width modulated signal which is a digital signal with a duty cycle and a frequency. The PWM signal takes either the logical value 1 or the logical value 0 at predetermined times. The frequency of the present PWM signal is given by the clock pulses of the clock signal. The duration of successive clocks within the cycle of the clock signal changes, which means that the frequency of the PWM signal is not constant. In particular, the frequency of the clock signal and the frequency of the PWM signal are identical. In particular, the frequency of a PWM signal increases during a cycle. Alternatively, the frequency of a PWM signal decreases during a cycle.

The duty cycle is a ratio of a duration during which the PWM signal takes the logical value 1 within a cycle to the total duration of the cycle.

The invention is based, inter alia, on the idea that the logic values set in the register units are weighted when the logic values are output as a PWM signal by varying the duration of the clocks over one cycle of the clock signal. The longer the duration of a clock, the greater the weighting of the value output during that clock. When generating a conventional PWM signal, a clock signal is used in which the duration of successive clocks is constant. Thus, the output logic values are not weighted, and it does not matter in a conventional PWM signal whether a logic value is output with the first clock of the clock signal within a cycle or with a subsequent clock within the cycle.

The method described here is based on the consideration that the information density of the information stored in the shift register is increased by weighting the logical values set in the register units by the clock signal. Thus, the shift register in method step a) can be set with a particularly low data rate.

In a conventional method, the number of adjustable duty cycles is n+1, where n is the number of register units. In the method described here, the number of possible duty cycles is 2n, where n is the number of register units. Thus, a larger number of different duty cycles of the PWM signal can be represented with the same number of register units.

At a clock signal in which the duration of the clocks changes over the cycle of the clock signal, the number of clocks per cycle is less than with a conventional clock signal. As a result, the number of switching operations in which the logic values present at the inputs of register units are transferred to outputs of the register units is reduced.

Advantageously, this reduces the number of parasitic current spikes and reduces crosstalk of the clock signal to other signals. The other signals comprise, for example, analog signals which serve as reference signals for controlling a current.

According to one embodiment of the method, the number of clocks in a cycle corresponds to the number of register units. The logical values to which the register units were set in method step a) are output in method step b) exactly during one cycle of the clock signal. With the first clock of a cycle in method step b), the PWM signal assumes the value of a first register unit of the register units set in method step a). With the last clock of a cycle in method step b), the PWM signal assumes the value of the value set in method step a) in a last register unit of the register units.

In particular, the register unit whose set value is output during the clock with the longest duration of a cycle is also called the MSB unit (MSB is the abbreviation for "Most Significant Bit"). The register unit whose set value is output during the clock with the shortest duration of a cycle may also be called the LSB unit (LSB is the English abbreviation for "Least Significant Bit"). For a clock signal in which the duration of successive clocks in a cycle increases, the value of the LSB unit is output in the first clock and the value of the MSB unit is output in the last clock. For a clock signal in which the duration of successive clocks of a cycle decreases, the value of the MSB unit is output in the first clock and the value of the LSB unit is output in the last clock.

According to one embodiment, process steps a) and b) are repeated alternately. In particular, the method step a) can start with the beginning of the last clock pulse of a cycle and be completed before the beginning of a first clock pulse of a subsequent cycle. For example, by the write unit, the outputs of the register units are each set to a predetermined logical value while the PWM signal is output at the output contact. The duration from the last clock signal of a cycle to the end of the cycle may correspond to the duration of half a cycle. In particular, the duration of the method step a) is at most equal to the duration of half a cycle. For example, the output of the PWM signal is not interrupted by the process step a). Advantageously, the duration of the last clock pulse of a cycle is particularly long, so that a particularly low data rate is required when setting the register units in process step a).

According to one embodiment, the register units are assigned ascending ordinal numbers starting from the output contact, wherein the output of the register unit with the lowest ordinal number is coupled to the input of the register unit with the highest ordinal number, and between two executions of process step a), process step b) is executed over a duration of several cycles (50).

Here and in the following, ordinal numbers are assigned to the register units in ascending order starting from the output contact. Consequently, no further register unit of the shift register is coupled between the first register unit and the output contact. Between the second register unit and the output contact, the first register unit is coupled. In other words, between a register unit of the shift register and the output contact all register units are coupled to which a smaller ordinal number is assigned.

The PWM signal assumes the value to which the register unit with the lowest ordinal number (first register unit) was set in method step a) during the first clock pulse of a cycle. In particular, the value of the first register unit set in method step a) is assumed by the PWM signal to be the shortest of all the values set in the shift register in method step b).

The PWM signal assumes the value to which the register unit with the highest ordinal number (last register unit) was set in method step a) during the last clock pulse of a cycle. In particular, the value of the last register unit set in process step a) is assumed by the PWM signal to be the longest of all the values set in the shift register in process step b).

The register units are coupled in such a way that the value of the output of the first register unit is applied to the input of the last register unit. With each clock pulse, the value at the output of the first register unit is applied to the output of the last register unit. In particular, the number of clocks during which process step b) is executed without process step a) being executed is greater than the number of register units of the register. Advantageously, a PWM signal which is constant over a plurality of cycles can be output from the output contact without performing the process step a) again with each cycle. Thus, it is not necessary that the register units for generating a PWM signal with a constant duty cycle be set again in the process step a) after each cycle of the clock signal. For example, the method step a) is performed only when the duty cycle of the PWM signal is changed. Advantageously, this allows the circuit to be operated with a particularly low data rate.

According to one embodiment, a holding unit is connected between the output contact and the output of the first register unit, wherein the holding unit in a first state sets the output contact to the value output by the first register unit at the output and the holding unit in a second state presets the value of the output contact. During the method step a), the holding unit is in the second state and during the method step b), the holding unit is in the first state.

For example, the holding unit may comprise a state-controlled bistable flip-flop. For example, in the first state, the holding unit is transparent to the value output from the shift register and passes it to the output contact. For example, in the second state, the holding unit is non-transparent to the value output by the shift register and passes to the output contact the value output by the first register unit at the time of the change from the first state to the second state. For example, the holding unit is provided to preset the logical value of the output contact while the register units of the register are set by the writing unit. Advantageously, this avoids an erroneous influence on the PWM signal due to performing the method step a).

According to one embodiment, in method step a) the outputs of the register units are set in parallel to a predetermined logical value by the write unit. For example, the register units each have a set contact and a reset contact. In this case, the output of the register units can be set to a first logic value by applying a logic value to the set contact, or the output of the register units can be set to a second logic value by applying a logic value to the reset contact. In step a), the write unit sets the outputs of the register units by applying a logic value to the set contact or reset contact.

Alternatively, the write unit comprises a plurality of multiplexers each arranged between two successive register units. The multiplexers comprise, for example, a first input coupled to the output of the preceding register unit and a second input set by the write unit to a predetermined logic value, wherein in a first state the output of the multiplexer takes the value of the first input and in a second state the output of the multiplexer takes the value of the second input. Furthermore, the multiplexer comprises a select contact by which it is possible to select between the two states, the multiplexer being in the second state during the process step a) and being in the first state during the process step b).

According to one embodiment, in method step a) the outputs of the register units are serially set to a predetermined value by the write unit. For example, the register units are also operated with the clock signal in the method step a). In particular, one of the register units is a setting unit which is provided for the writing unit to set its output to a predetermined value. With the clock of the clock signal, the value at the output of the setting unit is taken over by the register unit following the setting unit. For example, in the method step a), with each clock of the clock signal, a logical value to which one of the register units of the shift register is to be set is transferred from the write unit to the shift register. For example, the duration of the method step a) is the duration of one cycle of the clock signal.

A method of operating a light emitting arrangement is further provided. The light emitting arrangement comprises a circuit which is operated by the method for generating a PWM signal. Furthermore, the light emitting arrangement comprises a light emitting component which is driven by the PWM signal and, for example, a switchable current source at the output contact of the circuit, wherein the duty cycle of the PWM signal is predetermined by the values predetermined in the method step a) and an intensity of the radiation emitted by the light emitting component is adjusted by the duty cycle. In particular, in the method for operating the light-emitting device, the method for generating a PWM signal described above is carried out.

A method of operating a display arrangement is further provided. The display arrangement comprises a plurality of light emitting arrangements each comprising a circuit operated by a method for generating a PWM signal.

The light emitting components of the plurality of light emitting arrangements of the display arrangement are each part of a pixel of the display arrangement. The circuits of the plurality of light emitting arrangements are operated with a common clock signal or a clock signal which is common in groups.

The display arrangement is configured to successively display single images, also called frames, by the pixels. For example, the frames are displayed at a rate of at least 25 frames per second. During the duration of the display of a frame, the brightness of the radiation emitted by the light emitting components is perceived by the human eye as constant, since the minimum frequency of the cycles of the clock signal is greater than a frequency perceptible by the human eye. In particular, the duration of a cycle of the clock signal is at most equal to the duration for which a single image is displayed. A cycle of the clock signal may have a duration of at most $1/25$ second, preferably at most $1/60$ second, particularly preferably at most $1/100$ second.

For example, the display arrangement comprises a circuit previously described in which the output of the first register unit is coupled to the input of the last register unit. Thus, the duration of the display of a frame may be longer than the duration of a cycle of the clock signal. For example, the duration of a cycle is at least ten times, preferably at least 100 times, longer than the duration of the representation of a single frame.

For example, the circuit is operated such that the PWM signal comprises more than one change from a logical value 0 to a logical value 1 during the display of a frame. For example, the method step a) is executed only whenever a new frame is displayed. Advantageously, this means that the required amount of data which is transferred to the shift register via the write unit is particularly small.

A circuit for generating a PWM signal is further disclosed. In particular, the circuit can be used to perform the method for generating a PWM signal described herein. That is, all features disclosed for the circuit are also disclosed for the method for generating a PWM signal, and vice versa.

The circuit for generating a PWM signal comprises a shift register with a plurality of clock-controlled register units each having an input and an output, a write unit which is set to set the outputs of the register units to an intended logic value in each case, and a clock generator which is set to operate the register units with a common clock signal. In this case, the register units are connected in series so that in each case a value at one of the outputs of the register units is present at the input of the respective subsequent register unit. The register units are each configured to accept a logic value present at the input at their output with each clock pulse. Further, the shift register is configured to output the PWM signal at an output contact, wherein the PWM signal is a chronological sequence of the values set in the register units and the PWM signal takes each of the values with the duration of one clock of the clock signal. In this regard, the clock signal is cyclic. During a cycle, the duration of successive clocks changes, and the clock signal is identical per cycle. In particular, the duration of successive clocks increases or decreases during a cycle.

According to one embodiment, a holding unit is connected between the output contact and the output of the first register unit, wherein the holding unit in a first state sets the output contact to the value output by the first register unit and the holding unit in a second state presets the value of the output contact.

According to one embodiment, the register units are assigned ascending ordinal numbers starting from the output contact, wherein the output of the register unit with the lowest ordinal number is coupled to the input of the register unit with the highest ordinal number.

A light emitting arrangement is further disclosed. The light emitting arrangement may in particular comprise a circuit described herein, and the light emitting arrangement may in particular be operated by the method for operating a light emitting arrangement described hereinbefore. That is, all features disclosed for the light emitting arrangement are also disclosed for the circuit and for the methods for operating the light emitting arrangement and for generating a PWM signal, and vice versa.

According to one embodiment, the light-emitting device comprises a circuit described herein for generating a PWM signal and a light-emitting component. The light-emitting component is controllable by the PWM signal at the output contact of the circuit and, for example, a current source switchable by the PWM signal. By the writing unit, a duty cycle of the PWM signal is predeterminable, and by the duty cycle, an intensity of the radiation emitted by the light-emitting component is adjustable.

According to one embodiment, the light emitting arrangement comprises a plurality of circuits described herein, the circuits each having a light emitting component associated therewith and the light emitting components being arranged at nodes of an imaginary regular grid. For example, the light emitting arrangement is part of a lighting device. For example, the light emitting components are separately controllable from each other by the circuits. Thus, the intensity of the emitted light of the light emitting components is separately adjustable.

A display arrangement is further disclosed. The display arrangement comprises a light emitting arrangement described herein, and the light emitting arrangement of the display arrangement is particularly operable by the method of operating a display arrangement described above. That is, all features disclosed for the display arrangement are also disclosed for the light emitting arrangement and vice versa.

According to one embodiment, the display arrangement comprises a light emitting arrangement. The light emitting arrangement comprises a plurality of light emitting components, each of which is part of a pixel of the display arrangement. In particular, the pixels of the display arrangement are formed with at least three light-emitting components each.

The display arrangement is configured to sequentially display frames by the pixels. For example, the display arrangement is configured to display the frames at a rate of at least 25 frames per second. During the duration of the display of a single image, also called frame, the brightness of the radiation emitted by the light emitting components is perceived as constant by the human eye. The display arrangement comprises, for example, circuits in which the output of the first register unit is coupled to the input of the first register unit.

For example, the circuits can be operated synchronously with a common clock signal. In particular, the process step b) is performed during the display of a single image. In this case, the process step can be executed over the duration of several cycles. The method step a) is executed, for example, only when a new frame is displayed.

Further advantages and advantageous designs and further embodiments of the circuit, the light-emitting arrangement, the display arrangement, the method for generating a PWM signal, the method for operating a light-emitting arrangement and the method for operating a display arrangement result from the following embodiment examples shown in connection with the figures.

FIGS. 7, 8 and 9 show schematic representations of examples of clock signals used in the method of generating a PWM signal, the method of operating a light emitting arrangement and the method of operating a display arrangement.

Elements that are identical, similar or have the same effect are given the same reference signs in the figures. The figures and the proportions of the elements shown in the figures are not to be regarded as to scale. Rather, individual elements may be shown exaggeratedly large for better representability and/or for better comprehensibility.

Figure 1:
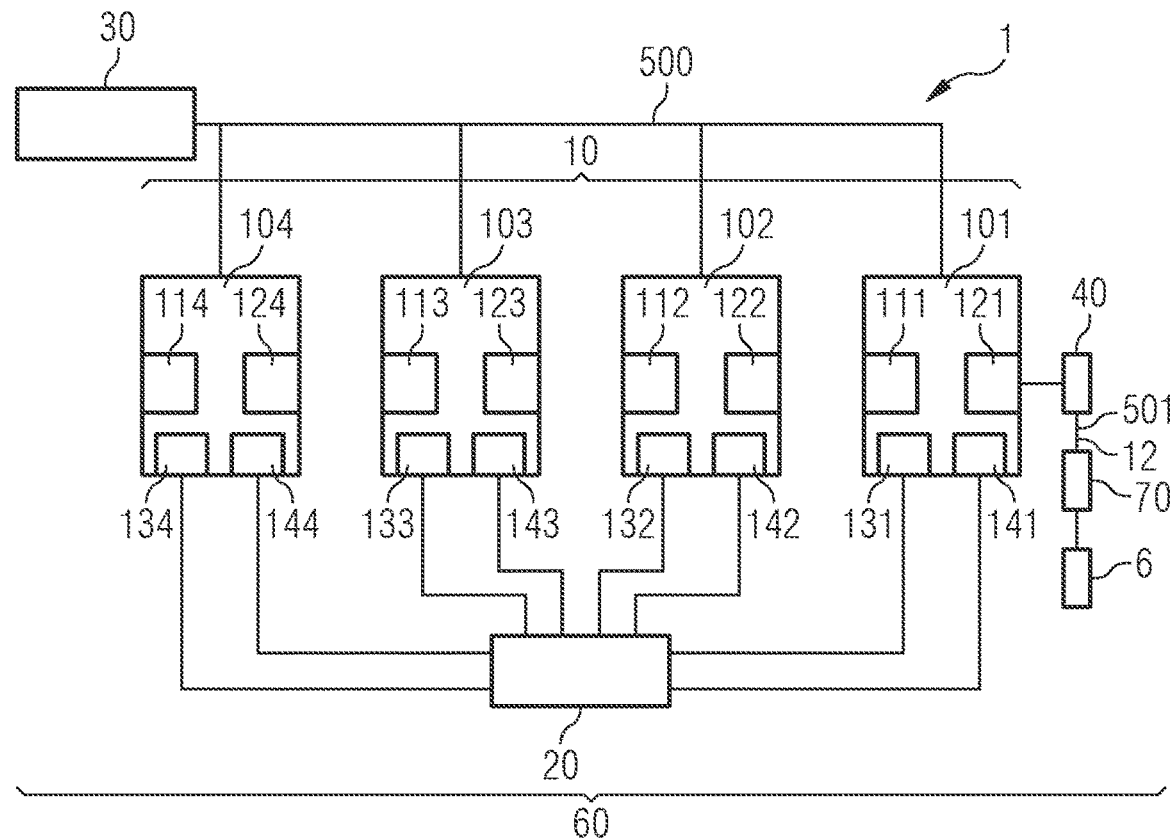
FIG. 1 shows a schematic representation of a light emitting arrangement.

FIG. 1 shows a schematic representation of a light emitting arrangement 60 according to an example embodiment. The light emitting arrangement 60 comprises a circuit 1 for generating a PWM signal 501, by which a method for generating a PWM signal 501 is performed. The circuit 1 includes a shift register 100 having four register units 10i, referred to as first 101, second 102, third 103, and fourth 104 register units. The circuit further comprises a clock generator 30, a write unit 20, and a holding unit 40.

The register units 10i are connected in series so that a logical value at the output 12i of one of the register units 10i is applied to the input 11i of the respective subsequent register unit 10i.

In the intended operation of the light-emitting arrangement 60, the method for generating a PWM signal 501 is carried out, wherein in a method step a) the outputs 12i of the register units 10i are each set in parallel to a predetermined logical value by the write unit 20. For this purpose, the register units 10i each have a set contact 13i and a reset contact 14i, wherein the output 12i of the register units 10i is set to the logical value 1 by applying a logical value 1 to the set contact 13i, or the output 12i of the register units 10i is set to a logical value 0 by applying a logical value 1 to the reset contact 14i.

The clock generator 30 is coupled to the register units 10i so that, in a method step b), the register units 10i are driven by a common clock signal 500.

The clock signal 500 is a cyclic digital signal with a plurality of clocks 5. At the start of a clock 5, the register units 10i each accept at their output 12i the logic value which is present at their input 11i.

The circuit 1 outputs the PWM signal 501 at an output contact 12, the PWM signal 501 being a chronological sequence of the logical values of the register units 10i set in the method step a). The PWM signal 501 is a digital pulse width modulated signal having a duty cycle and a frequency. The duty cycle is a ratio during a cycle 50 of the duration for which the PWM signal takes the logic value 1 to the total duration of the cycle 50, and may also be referred to as the duty cycle. The PWM signal 501 assumes each of the logic values set in the register units 10i for the duration of one cycle 5 of the clock signal 500. Thus, by the logic values set in method step a), the duty cycle of the PWM signal 501 is predetermined.

The clock signal 500 is identical per cycle 50 and comprises as many clocks 5 per cycle 50 as the shift register 100 comprises register units 10i. During a cycle 50, the duration of successive clocks 5 changes, for example lengthens, in particular doubles. Alternatively, the duration of successive clocks shortens, in particular halves, during a cycle 5. The frequency of the PWM signal 501 corresponds to the frequency of the clocks 5. If the clocks 5 lengthen during a cycle, the frequency of the clocks 5 decreases over the duration of a cycle 50, and the frequency of the PWM signal 501 decreases over the duration of a cycle 50. If the clocks 5 shorten during a cycle 50, the frequency of the clocks 5 increases over the duration of a cycle 50, and the frequency of the PWM signal 501 increases over the duration of a cycle 50.

The holding unit 40 is connected between the output contact 12 and the output 121 of the first register unit 101. In a first state, the holding unit 40 sets the output contact 12 to the logical value output from the output 121 of the first register unit 101. In other words, in the first state, the holding unit 40 is transparent to the signal output from the shift register 100. In a second state, the holding unit 40 provides the logical value of the output contact 12. In other words, in the second state, the holding unit 40 is opaque to the signal output from the shift register 100.

During step a), the holding unit 40 is in the second state, and during step b), the holding unit is in the first state 41. In particular, the holding unit 40 is configured in such a way that, during the process step a), the logical value of the output contact 12 is held, by the holding unit 40, at the value which was output from the first register unit 101 at the output 121 immediately before the start of the process step a).

In the method for generating a PWM signal 501, the method steps a) and b) are repeated alternately. In particular, the method step a) starts at the beginning of the last clock 5 of a cycle 50 of the clock signal 500 and is completed before the beginning of the first clock 5 of the following cycle 50.

During the execution of the method step a), the output contact 12 is held at a fixed logic value by the holding unit.

The light emitting arrangement 60 comprises a light emitting component 6, which is configured to emit light during intended operation. For example, the light emitting component is a light emitting diode. The light-emitting component 6 is coupled to the output contact 12 of the circuit 1 via a switchable driver 70, in particular a switchable current source, and is driven by the PWM signal 501. By the duty cycle of the PWM signal 501, an intensity of the radiation emitted by the light emitting component 6 is adjusted.

Figure 2:
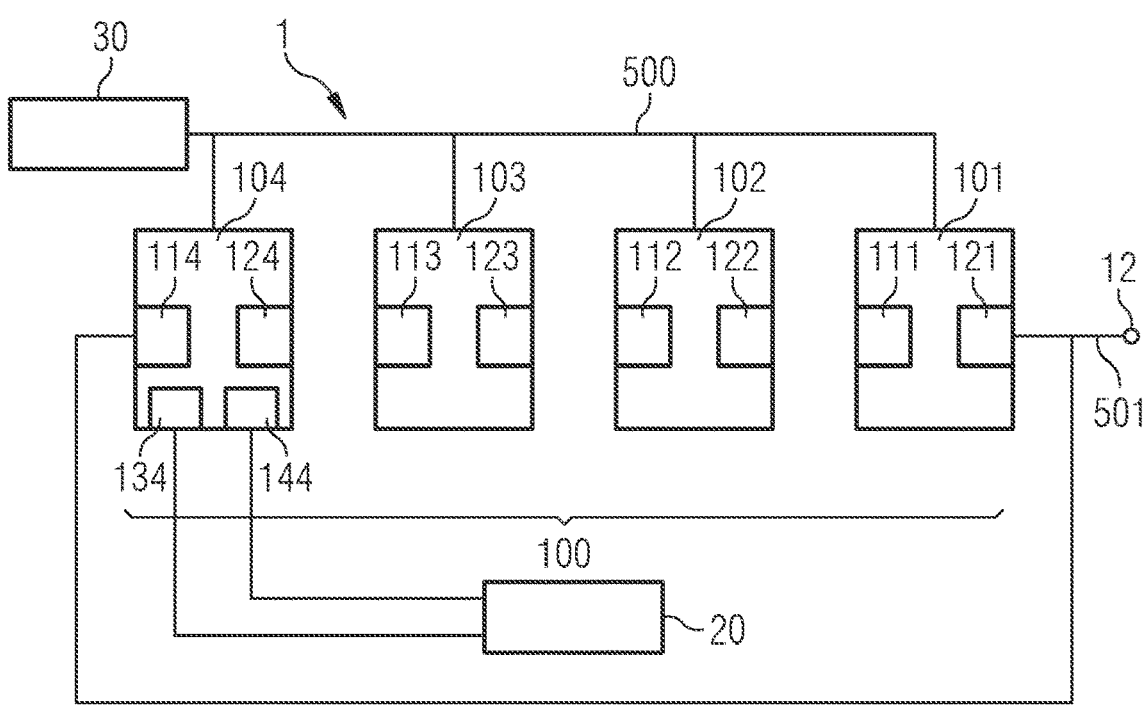
FIGS. 2, 3 and 4 show schematic representations of circuits for generating a PWM signal according to examples.

FIG. 2 shows a schematic representation of a circuit 1 for generating a PWM signal 501 according to an example embodiment. In the circuit 1 shown in FIG. 2, the output 121 of the first register unit 101 is coupled to the input 114 of the last register unit 104.

In method step a), the register units 10i are set serially or sequentially to a predetermined logical value by the write unit 20. Only one of the register units 10i, in this case the fourth register unit 104, comprises a set contact 134 and a reset contact 144, by which the logic value of the output 124 can be preset independently of the value of the input 114.

In method step a), the following method steps i and ii are performed for setting the outputs 12i of the register units 10i.

In method step i, the output 124 of the fourth register unit 104 is set to a logical value by the write unit 20. This value is applied to the input 113 of the subsequent third register unit 103.

In the method step ii, a clock 5 is output by the clock generator 30 so that the value set in step i is accepted at the output 123 of the third register unit 103.

Method steps i and ii are repeated alternately during method step a) until all outputs 12i of register units 10i are set to a predetermined value. In the method step a), by the write unit 20, the outputs of the register units 10i are serially set to a predetermined logical value as the logical values are sequentially loaded into the register units 10i.

Further, the embodiment illustrated in FIG. 2 differs from the embodiment illustrated in FIG. 1 in that the output 121 of the first register unit 101 is coupled to the input 114 of the last register unit 104. Thus, the logic value of the output 121 of the first register unit 101 is present at the input 114 of the fourth register unit 104. In method step b), the value of the output 121 of the first register unit 101 is accepted at the output 124 of the fourth register unit 104 after each clock pulse 5.

In the method of generating a PWM signal 501 by the circuit 1 shown in FIG. 2, the method step b) may be carried out over the duration of a plurality of cycles 50 of the clock signal 500 without carrying out the method step a). In particular, the method step a) is performed only when the duty cycle of the PWM signal 501 is changed.

Figure 3:
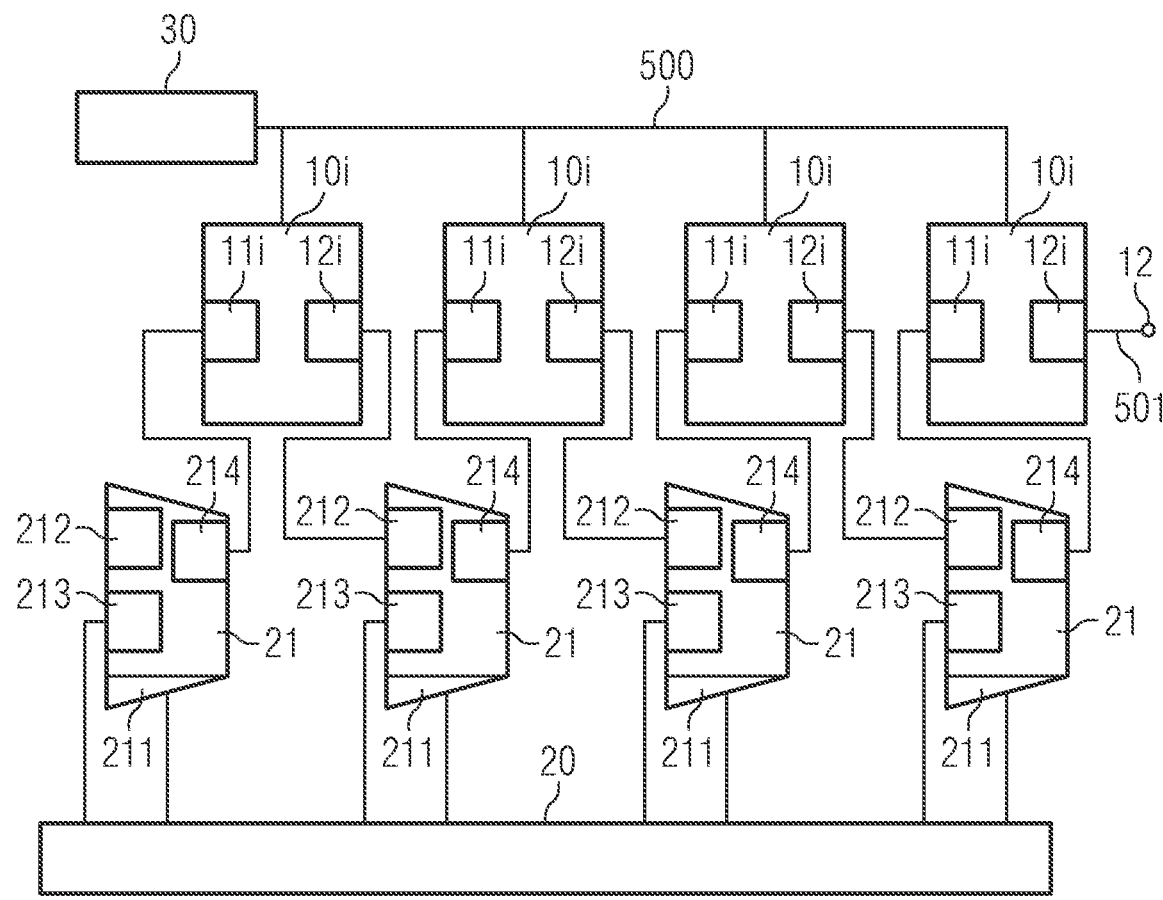

FIG. 3 shows a schematic representation of a circuit 1 for generating a PWM signal 501 according to an embodiment. In the method for generating a PWM signal, in method step a) the outputs 12i of the register units 10i are set in parallel to a predetermined logic value by the write unit 20. For this purpose, the write unit 20 comprises a plurality of multiplexers 21 each arranged between two successive register units 10i. The multiplexers 21 comprise, for example, a first input 212 which is coupled to the output 12i of the preceding register unit 10i, and a second input 213 which is set to a predetermined logic value by the write unit 20. In a first state of the multiplexer 21, the output 214 of the multiplexer 21 takes the logic value of the first input 212 and in a second state, the output 214 of the multiplexer 21 takes the logic value of the second input 213. Furthermore, the multiplexer 21 comprises a select contact 211 by which it is possible to select between the two states. The multiplexers 21 are in the second state during the method step a), so that the logic value which is respectively present at the inputs 11i of the register units 10i can be preset by the write unit 20. In the method step a), a clock 5 is output by the clock generator 30, wherein the register units 10i each take over the value present at the input 11i at their output 12i.

During the process step b), the multiplexers 21 are in the first state, so that the logical value of the output 12i of the preceding register unit 10i is present at the inputs 11i of each of the register units 10i. As in the embodiment example described in connection with FIG. 2, it is optionally possible that the output 121 of the first register unit 101 is coupled to the input 114 of the fourth register unit 104. Thus, the method step a) need only be performed when the sampling rate of the PWM signal 501 is changed.

Figure 4:
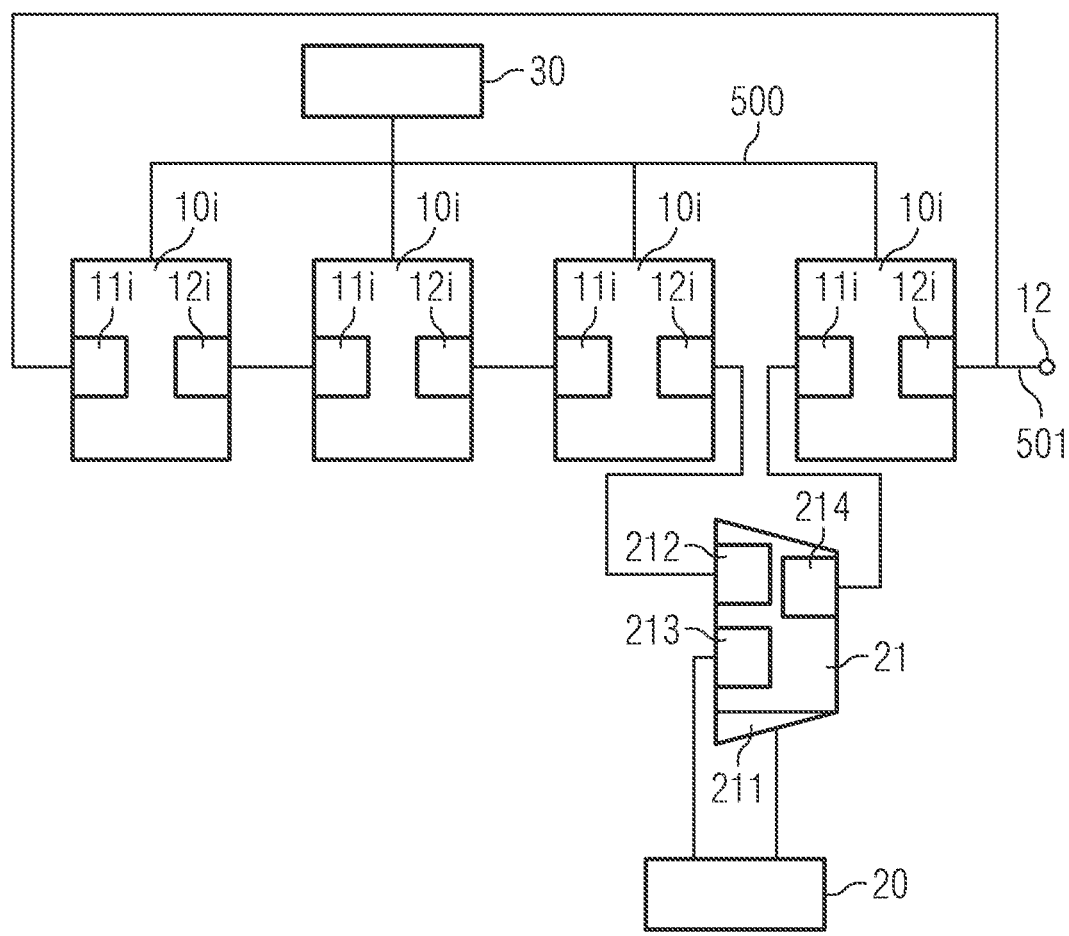

FIG. 4 shows a schematic representation of a circuit 1 for generating a PWM signal 501 according to an embodiment example. This embodiment example differs from the embodiment example shown in FIG. 3 in that the write unit 20 comprises only one multiplexer 21. The multiplexer 21 is located between two successive register units 10i.

In the method of generating a PWM signal 501 by the present circuit 1, in the method step a), the logic values of the outputs 12i of the register units 10i are set serially similar to the embodiment example described in connection with FIG. 2. The multiplexer 21 is in the second state during the process step a).

In order to set the outputs 12i of the register units 10i to predetermined logical values in the method step a), the following steps iii and iv are repeated alternately until all outputs 12i of the register units 10i are set to a predetermined value. In step iii, by the write unit 20, the logic value at the output 214 of the multiplexer 21 is predetermined. In step iv, a clock 5 is output by the clock generator 30. By the clock pulse 5, the value of the output 214 of the multiplexer 21 is applied to the output 121 of the downstream first register unit 101.

Figure 5:
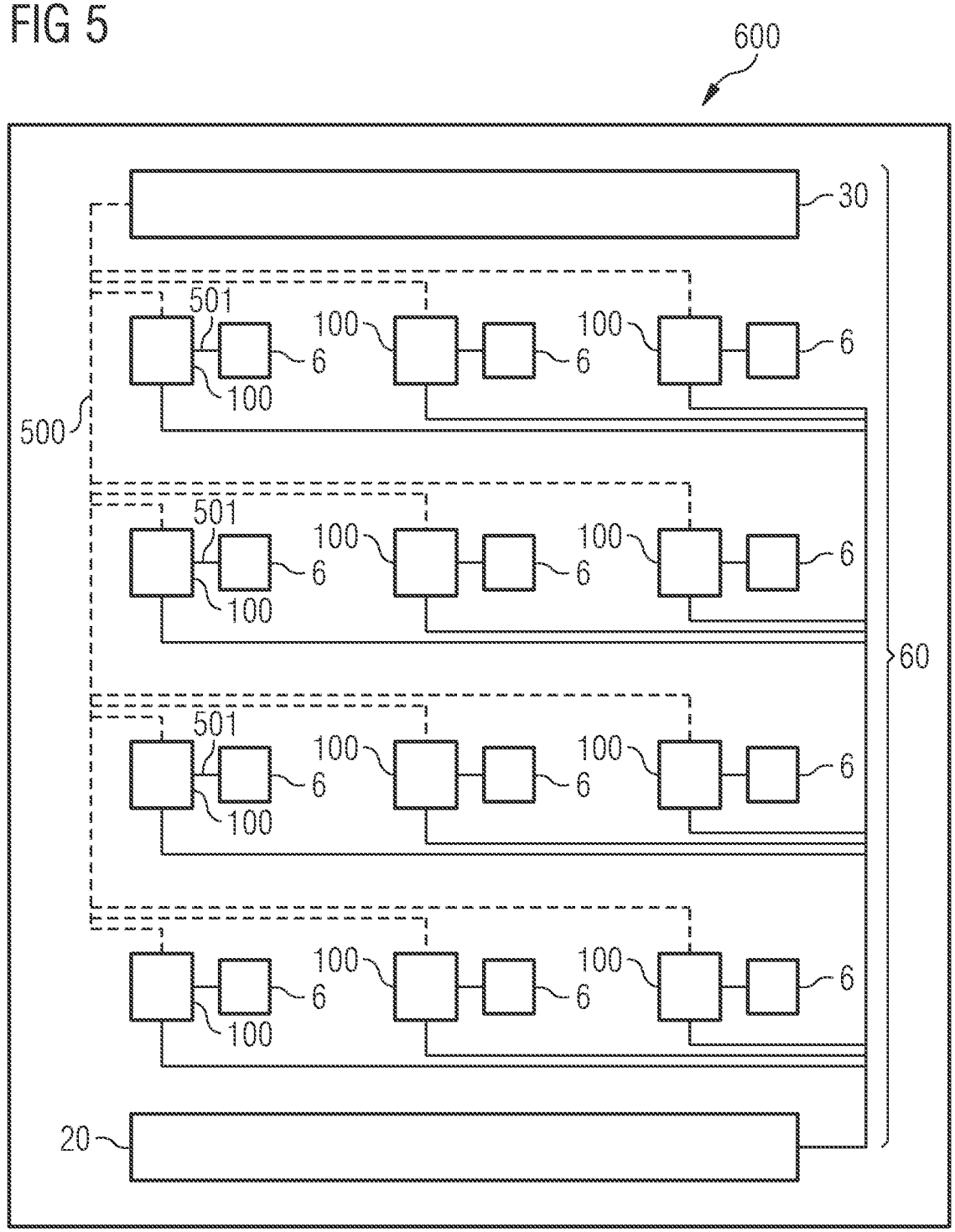
FIGS. 5 and 6 show schematic representations of display arrangements having a plurality of light emitting arrangements according to examples.

FIG. 5 shows a schematic representation of a display arrangement 600 according to an example embodiment. The display arrangement 600 comprises a light emitting arrangement 60 having a plurality of shift registers 100, each of which is associated with a light emitting component 6. The shift registers 100 are coupled to a common write unit 20 and to a common clock generator 30. A light emitting component 6 is associated with each of the shift registers 100. The light emitting components 6 are located at nodes of an imaginary regular grid.

The light emitting components 6 are each part of a pixel of the display arrangement 600. For example, a pixel of the display arrangement 600 is configured to emit light of an adjustable color and an adjustable intensity. Both the color and the intensity of the emitted light can be predetermined by the PWM signal 501.

In the intended operation, the display arrangement 600 is provided for successively displaying individual images, so-called frames, by the pixels. For example, the frames are displayed at a frequency of at least 25 Hz, so that a frame is displayed for at most 1/25 second. During a frame, the intensity and the color of the light emitted by the pixels are perceived as constant by the human eye. Thus, during the display of a frame, the duty cycle of the PWM signal 501 output from the circuits is constant.

In particular, in each of the shift registers 100, the output 121 of the first register unit 101 is connected to the input 11i of the last register unit 10i, so that the duty cycle of the PWM signal 501 is not changed until the method step a) is performed. Thus, the method step a) need only be performed when a new frame is to be displayed. Advantageously, this enables particularly low data transmission rates to be required during the process step a).

The shift registers 100 of the display arrangement 600 are driven by a common clock signal 500. For example, the duration of a cycle 50 of the clock signal 500 is at most as long as the duration of the display of a single image. In particular, the duration of the display of a single image is at least 5 times, preferably at least 10 times, longer than the duration of a cycle 50 of the clock signal.

Figure 6:
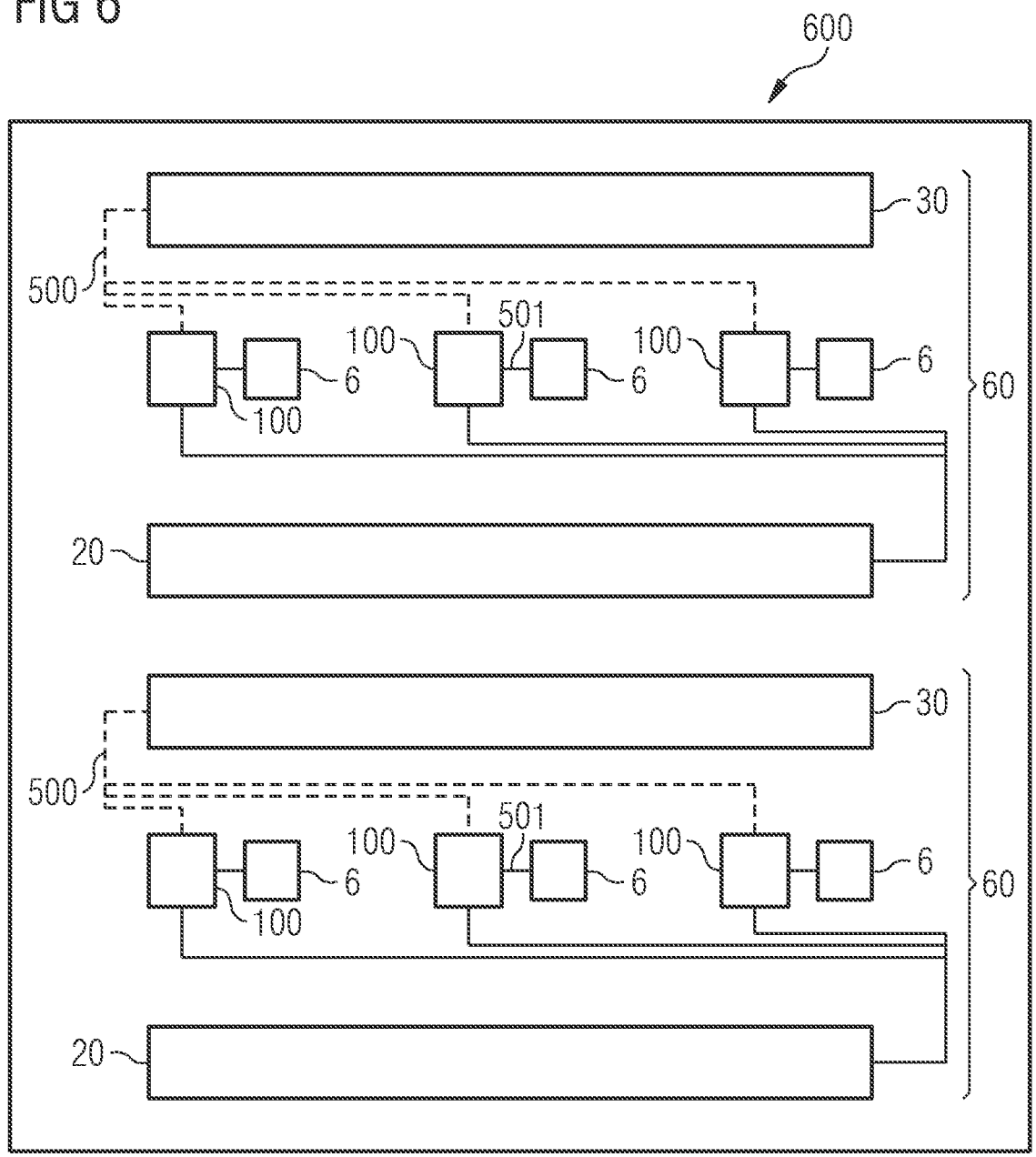

FIG. 6 shows a schematic representation of a display arrangement 600 according to an embodiment. The display arrangement 600 comprises two light emitting arrangements 60 each comprising three shift registers 100, the shift registers 100 each having a light emitting component 6 associated therewith. The light emitting components 6 are arranged at the nodes of an imaginary regular grid, and are part of pixels of the display arrangement 600.

The display arrangement 600 comprises a plurality of light emitting arrangement 60 each having a plurality of shift registers 100 and light emitting components 6. The light emitting components 6 and the associated shift registers 100 are arranged in rows side by side. In the method step a), the logical values are written in parallel into a row of shift registers 100 by the write unit 20.

FIG. 7 shows a schematic representation of the timing of a clock signal 500 according to an example embodiment. Such a clock signal 500 is output by the clock generator 20, for example, in the method described herein for generating a PWM signal, the method described herein for operating a light-emitting device and the methods described herein for operating a display arrangement. Plotted on the ordinate axis are the logical values 0 and 1 that the clock signal 500 assumes. The logical values may be, for example, two different electrical voltages. The time t is plotted on the abscissa axis.

One period of the clock signal corresponds to one clock pulse 5 of the clock signal 500. The clock signal is a cyclic signal, whereby a cycle 50 comprises four clock pulses 5. In FIG. 7, the beginning and the end of each cycle 50 are marked with dashed lines. The number of clocks 5 of a cycle 50 can correspond to the number of register units 10$i$ of the shift register 100. The clock signal is identical for each cycle 50. Within each cycle 50, the duration of the successive clocks 5 increases, in particular doubles.

FIG. 8 shows the time course of a clock signal 500 (FIG. 8a)) and a PWM signal 501 (FIG. 8b)). The PWM signal 501 is generated, for example, by a method described herein for generating a PWM signal. The clock signal 500 and the PWM signal 501 assume the logical values 0 or 1, which are respectively plotted on the abscissa.

FIG. 8a) illustrates a cycle 50 of the clock signal 500, the cycle 50 comprising four clocks 5. Over the cycle 50, the duration of successive clocks 5 is doubled in each case.

The PWM signal 501, which is shown in FIG. 8b), is output at the output contact 12 of a circuit 1 in the method for generating a PWM signal 501. In this process, the shift register 100 of the circuit 1 is driven by the clock signal 500 of FIG. 8a). The PWM signal 501 is a chronological sequence of the logic values set in the register units 10$i$ in the process step a). In this case, the register units 10$i$ are clock edge-controlled register units, which each take over the logic value present at the input 11$i$ on a positive edge of the clock signal 500 at the output 12$i$. Thus, with each positive clock edge of the clock signal 500, a new one of the set logic values is output at the output contact 12.

Presently, in the method step a), the first register unit 101 was set to the logical value 0, the second register unit 102 was set to the logical value 1, the third register unit 103 was set to the logical value 0, and the fourth register unit 104 was set to the logical value 1. Consequently, the PWM signal 501 successively takes the values 0, 1, 0 and 1 for the duration of one clock cycle each. During the first and shortest clock pulse 5 of the clock signal 500, the PWM signal 501 assumes the logic value 0 of the first register unit 101. During the second clock 5, the PWM signal takes the value 1 of the second register unit 102. During the third clock 5, the PWM signal 501 takes the logical value 0 of the third register unit 103. During the fourth and longest clock cycle 5, the PWM signal 501 takes the logical value 1 of the fourth register unit 104. Thus, the PWM signal 501 successively assumes the values of the register units 10$i$ set in the method step a). In this case, the duration for which the PWM signal 501 assumes these logic values corresponds to the duration of the clock pulses 5 of the clock signal 500.

FIG. 9 shows in a schematic representation the time course of a clock signal 500 and a PWM signal 501 according to an example of an example embodiment. Of the clock signal 500, a cycle 50 with six clocks 5 is shown. This clock signal 500 is used to operate a shift register 100 having six register units 10$i$. The first to sixth register units were set to the logical values 0, 1, 1, 0 and 1 in this order in the method step a). The PWM signal 501 output in the method step b) is a chronological sequence of the logical values set in the register units 10$i$.

The dashed lines between diagrams a) and b) each mark the start of a clock pulse 5 of the clock signal 500. Always at the start of a clock pulse 5, the PWM signal 501 assumes a new one of the logic values set in process step a).

The invention is not limited to the embodiments by the description based thereon. Rather, the invention encompasses any new feature as well as any combination of features, which in particular includes any combination of features in the patent claims, even if this feature or combination itself is not explicitly stated in the patent claims or embodiments.

LIST OF REFERENCE SIGNS 1 circuit
100 shift register
10$i$ register unit
10L LSB unit
10M MSB unit
11$i$ input of a register unit
11L LSB unit input
11M MSB unit input
12$i$ output of a register unit
12L LSB unit output
12M MSB unit output
12 output contact
13$i$ set contact
14$i$ reset contact
20 write unit
21 multiplexer
211 select contact
212 first input of the multiplexer
213 second input of the multiplexer
214 output of the multiplexer
30 clock generator
40 holding unit
41 first state
42 second state 5 clock
50 cycle
500 clock signal
501 PWM signal
6 light-emitting component
60 light emitting arrangement
600 display arrangement
70 switchable driver
t time

The invention claimed is:

1. A method for generating a PWM signal by a circuit comprising
a shift register comprising a plurality of clock-controlled register units each having an input and an output,
a write unit configured to set the outputs of the register units each to a designated logic value, and
a clock generator configured to output a clock signal, wherein the register units are connected in series, so that in each case a logic value at the output of one of the register units is present at the input of the respectively following register unit,
a) wherein the outputs of the register units are each set to a predetermined logical value by the write unit, and
b) the register units are operated together by the clock signal, wherein the register units take over the respective logical value of the input at the output with each clock pulse, wherein the clock signal is cyclic,
wherein during a cycle the duration of successive clocks increases,
wherein the shift register outputs the PWM signal at an output contact, the PWM signal being a chronological sequence of the logic values set in the register units, and the PWM signal assumes each of the logic values with the duration of one clock of the clock signal, and
wherein one or more of:
ascending ordinal numbers are assigned to the register units starting from the output contact,
the output of the register unit with the lowest ordinal number is coupled to the input of the register unit with the highest ordinal number, and
between two executions of the process step a) the process step b) is executed over a duration of several cycles; or
a holding unit is coupled between the output contact and the output of a first register unit of the plurality of register units,
in a first state, the holding unit sets the output contact to the logic value provided at the output of the first register unit,
in a second state, the holding unit sets the logical value of the output contact,
the holding unit is in the second state during step a), and
the holding unit is in the first state during step b).

2. The method according to claim 1,
in which the number of clocks of a cycle corresponds to the number of register units.

3. The method according to claim 1,
in which process steps a) and b) are repeated alternately.

4. The method according to claim 1,
in which, in method step a), the outputs of the register units are set in parallel to a predetermined logic value by the write unit.

5. The method according to claim 1,
in which, in method step a), the outputs of the register units are set serially to a predetermined logic value by the write unit.

6. The method of operating a light emitting arrangement comprising:
a circuit which is operated according to claim 1, and
a light-emitting component which is driven by the PWM signal at the output contact of the circuit,
wherein a duty cycle of the PWM signal is predetermined by the logic values predetermined in method step a), and
an intensity of the radiation emitted from the light-emitting component is adjusted by the duty cycle.

7. The method of operating a display arrangement comprising a plurality of light emitting arrangements each operated by a method according to claim 6, wherein
the light emitting components are each part of a pixel of the display arrangement, and
circuits are operated with a common clock signal.

8. A circuit for generating a PWM signal, comprising:
a shift register comprising a plurality of clock-controlled register units each having an input and an output,
a write unit configured to set the outputs of the register units each to a designated logical value, and
a clock generator configured to drive the register units by a common clock signal,
wherein the register units are connected in series, so that in each case a logic value at one of the outputs of the register units is applied to the input of the respective subsequent register unit,
wherein the register units are each configured to accept at their output, with each clock pulse, a logic value applied at their input,
wherein the shift register is configured to output the PWM signal at an output contact, wherein the PWM signal is a chronological sequence of the logical values set in the register units, and the PWM signal assumes each of the logical values with the duration of one clock of the clock signal,
wherein the clock signal is cyclic,
wherein during a cycle the duration of successive clocks increases,
wherein the clock signal per cycle is identical,
wherein ascending ordinal numbers are assigned to the register units starting from the output contact, and
wherein the output of the register unit with the lowest ordinal number is coupled to the input of the register unit with the highest ordinal number.

9. The circuit according to claim 8, wherein
a holding unit is connected between the output contact and the shift register,
in a first state, the holding unit sets the output contact to the logical value output from the shift register, and
in a second state, the holding unit sets the logical value of the output contact.

10. A light emitting arrangement comprising a circuit according to claim 8 and a light emitting component, wherein
the light-emitting component can be driven by the PWM signal of the circuit,
a duty cycle of the PWM signal can be preset by the write unit, and
an intensity of the radiation emitted by the light-emitting component can be adjusted by the duty cycle.

11. The light emitting arrangement according to claim 10 comprising a plurality of circuits, wherein
a light-emitting component is assigned to each of the circuits, and the light-emitting components are arranged at nodes of an imaginary regular grid.

12. A display arrangement comprising a light emitting arrangement according to claim 11,
   wherein the light emitting components are each part of a pixel of the display arrangement.

13. A circuit for generating a PWM signal, comprising:
   a shift register comprising a plurality of clock-controlled register units each having an input and an output,
   a write unit configured to set the outputs of the register units each to a designated logical value, and
   a clock generator configured to drive the register units by a common clock signal,
   wherein the register units are connected in series, so that in each case a logic value at one of the outputs of the register units is applied to the input of the respective subsequent register unit,
   wherein the register units are each configured to accept at their output, with each clock pulse, a logic value applied at their input,
   wherein the shift register is configured to output the PWM signal at an output contact, wherein the PWM signal is a chronological sequence of the logical values set in the register units, and the PWM signal assumes each of the logical values with the duration of one clock of the clock signal,
   wherein the clock signal is cyclic,
   wherein during a cycle the duration of successive clocks increases,
   wherein the clock signal per cycle is identical,
   wherein a holding unit is connected between the output contact and the shift register,
   wherein in a first state, the holding unit sets the output contact to the logical value output from the shift register, and
   wherein in a second state, the holding unit sets the logical value of the output contact.

* * * * *